(12) United States Patent
Conn

(10) Patent No.: US 7,084,487 B1
(45) Date of Patent: Aug. 1, 2006

(54) SHIELDED PLATFORM FOR DIE-BONDING AN ANALOG DIE TO AN FPGA

(75) Inventor: Robert O. Conn, Los Gatos, CA (US)

(73) Assignee: Xilinx, Inc., San Jose, CA (US)

( * ) Notice: Subject to any disclaimer, the term of this patent is extended or adjusted under 35 U.S.C. 154(b) by 408 days.

(21) Appl. No.: 10/732,494

(22) Filed: Dec. 9, 2003

(51) Int. Cl.
*H01L 23/552* (2006.01)

(52) U.S. Cl. .............. 257/660; 257/777; 257/E21.511; 438/108

(58) Field of Classification Search ............ 257/659, 257/660, 678, 686, 777, 778, 782, E21.503, 257/E21.511; 438/106, 108
See application file for complete search history.

(56) References Cited

U.S. PATENT DOCUMENTS

| 2004/0124511 A1* | 7/2004 | Li ........................... 257/678 |
| 2005/0035436 A1* | 2/2005 | Novak et al. ............... 257/678 |

OTHER PUBLICATIONS

U.S. Appl. No. 10/610,207, filed Jun. 30, 2003, New et al.

* cited by examiner

*Primary Examiner*—Brook Kebede
(74) *Attorney, Agent, or Firm*—T. Lester Wallace

(57) ABSTRACT

An integrated circuit die contains digital circuitry that emits noise (for example, in the audio frequency range) in the form of electromagnetic radiation. The integrated circuit die is provided with a shielded platform above the digital circuitry. The shielded platform has one metal plate that is coupled to an analog supply voltage source and another metal plate that is coupled to an analog ground terminal. The digital circuitry is coupled to a digital supply voltage source. A second die with noise-sensitive analog circuitry is stacked on the shielded platform and is shielded by the shielded platform from the noise. The analog circuitry is powered by the analog supply voltage source. Conductive vias in a predetermined pattern protrude through the shielded platform and provide a standardized way of connecting any one of numerous noise-sensitive second dice to the relatively noisy digital circuitry of the underlying die.

20 Claims, 5 Drawing Sheets

SHIELDED PLATFORM FOR DIE-BONDING AN ANALOG DIE TO AN FPGA

FIELD OF THE INVENTION

The present invention relates to reducing noise in integrated circuits, and more specifically to shielding an analog circuit from electromagnetic noise generated by a digital circuit.

BACKGROUND INFORMATION

Programmable logic devices, such as field programmable gate arrays (FPGAs), typically radiate electromagnetic noise during operation. Noise generated by digital circuitry in an FPGA can hamper the operation of nearby analog circuitry. For example, noise generated by an FPGA can unintentionally be amplified by an analog audio amplifier die that is mounted on the same printed circuit board.

FIG. 1 (prior art) illustrates an analog application of an FPGA involving a cell phone. FIG. 1 is a simplified cross-sectional diagram of an FPGA die 10 in an integrated circuit package 11 disposed on a printed circuit board 12. An analog audio amplifier die 13 is mounted separately on the printed circuit board 12.

Radio frequency (RF) signals 14 are received by an antenna 15 and converted to intermediate frequency (IF) signals 16 by RF circuitry 17. The IF signals 16 are then communicated to FPGA die 10 through a trace 18 on printed circuit board 12 and through a bond wire 19 between package 11 and FPGA die 10. To simplify the diagram, the lid of package 11 is not shown in FIG. 1.

IF signals 16 are digitized, and then digital signal processing is performed by DSP circuitry 20 on FPGA die 10. Audio signal processing is then performed by audio control circuitry 21 and audio synthesis circuitry 22 in FPGA die 10. The resulting audio signals are then communicated from FPGA die 10 to audio amplifier die 13 through a bond wire 23, a trace 24 on printed circuit board 12 and through a bond wire 25 between audio amplifier die 13 and its package 26. Audio amplifier die 13 drives a speaker 27.

FPGA 10 contains circuitry, such as DSP circuitry 20, that operates using high frequency signals and exhibits fast switching transients. Circuitry in FPGA 10 therefore typically emits substantial electromagnetic radiation in the audio frequency range. FPGA 10 also draws surges of current from power/ground supply 28. This results in the power and ground supplied to the FPGA 10 to include noise. If audio amplifier die 13 were powered directly by power/ground supply 28, then audio amplifier die 13 may pick up some of this noise. To combat this problem, audio amplifier die 13 is powered by separate, isolated analog power and ground signals 29. An analog power regulator 30 regulates power/ground supply 28 and outputs analog power and ground signals 29. A separate logic power regulator 31 is also coupled to power/ground supply 28 and outputs the ground and Vcc signals that power the digital circuitry in FPGA die 10. Voltage regulators 30 and 31 are typically disposed on printed circuit board 12.

The analog application of FPGA die 10 shown in FIG. 1 employs considerable printed circuit board space. Moreover, power is consumed as signals are driven from FPGA die 10 to audio amplifier die 13 through bond wire 23, physically-large trace 24 and bond wire 25.

A more compact and lower-power solution is desired.

SUMMARY

An integrated circuit die contains digital circuitry that emits noise in the form of electromagnetic radiation in the audio frequency range. A second die contains analog circuitry that is sensitive to noise in the audio frequency range. The integrated circuit die and the second die together perform an analog application, such as driving the speaker of a cell-phone.

The integrated circuit die is provided with a shielded platform above the digital circuitry. The second die is stacked on the shielded platform and is shielded from the noise emitted by the digital circuitry.

In one embodiment, the shielded platform has one metal plate that is coupled to an analog supply voltage source and another metal plate that is coupled to an analog ground terminal. The analog circuitry of the second die is powered by the analog supply voltage source, whereas the digital circuitry of the integrated circuit die is powered by a digital supply voltage source.

In one embodiment, conductive vias in a predetermined pattern protrude through the shielded platform and provide a standardized way of connecting the digital circuitry of the integrated circuit die to circuitry on the second die. Numerous different types of second dice can be connected to the integrated circuit die if they have micropads or microbumps in a pattern that mates with the predetermined pattern of conductive vias that protrude through the shielded platform.

In one embodiment, the integrated circuit die is a programmable logic device, and the shielded platform is an integral part of the integrated circuit die. The metal layers of the shielded platform are made of metal of the upper layer or layers of metal of the integrated circuit die. The programmable logic device is laid out as a plurality of repeatable tiles, where some of the tiles are interconnection input/output (IOI) tiles. One of the IOI tiles is used as a mechanism to couple a signal communicated from or to a second die disposed on the shielded platform into the programmable interconnect structure of the underlying programmable logic device.

The second die need not involve analog circuitry, but rather the second die can involve other noise sensitive circuitry such as an analog-to-digital converter, a digital-to-analog converter, or an radio frequency (RF) receiver or transmitter. The noise to which the second die is sensitive may not be in the audio range (0 to 40 kHz), but rather may be noise of a higher frequency. An A/D converter having a data input that is susceptible to noise in the range of the A/D sample rate (for example, 100 kHz), may for example be shielded from such noise by the shielded platform.

A method is disclosed of shielding noise-sensitive circuitry of a second die from noisy digital circuitry of an underlying integrated circuit die. The digital circuitry of the underlying integrated circuit die is powered by a direct current (DC) digital supply voltage, whereas the noise-sensitive circuitry of the second die is powered by an isolated direct current (DC) analog supply voltage. The underlying integrated circuit die includes a conductive shield plate. The conductive shield plate is disposed between the noisy digital circuitry of the integrated circuit die and the noise-sensitive circuitry of the second die. The DC analog supply voltage is supplied to the conductive shield plate.

Other structures and methods are described in the detailed description below. This summary does not purport to define the invention. The invention is defined by the allowed claims.

BRIEF DESCRIPTION OF THE FIGURES

The accompanying drawings, where like numerals indicate like components, illustrate embodiments of the invention.

DETAILED DESCRIPTION

Figure 1:
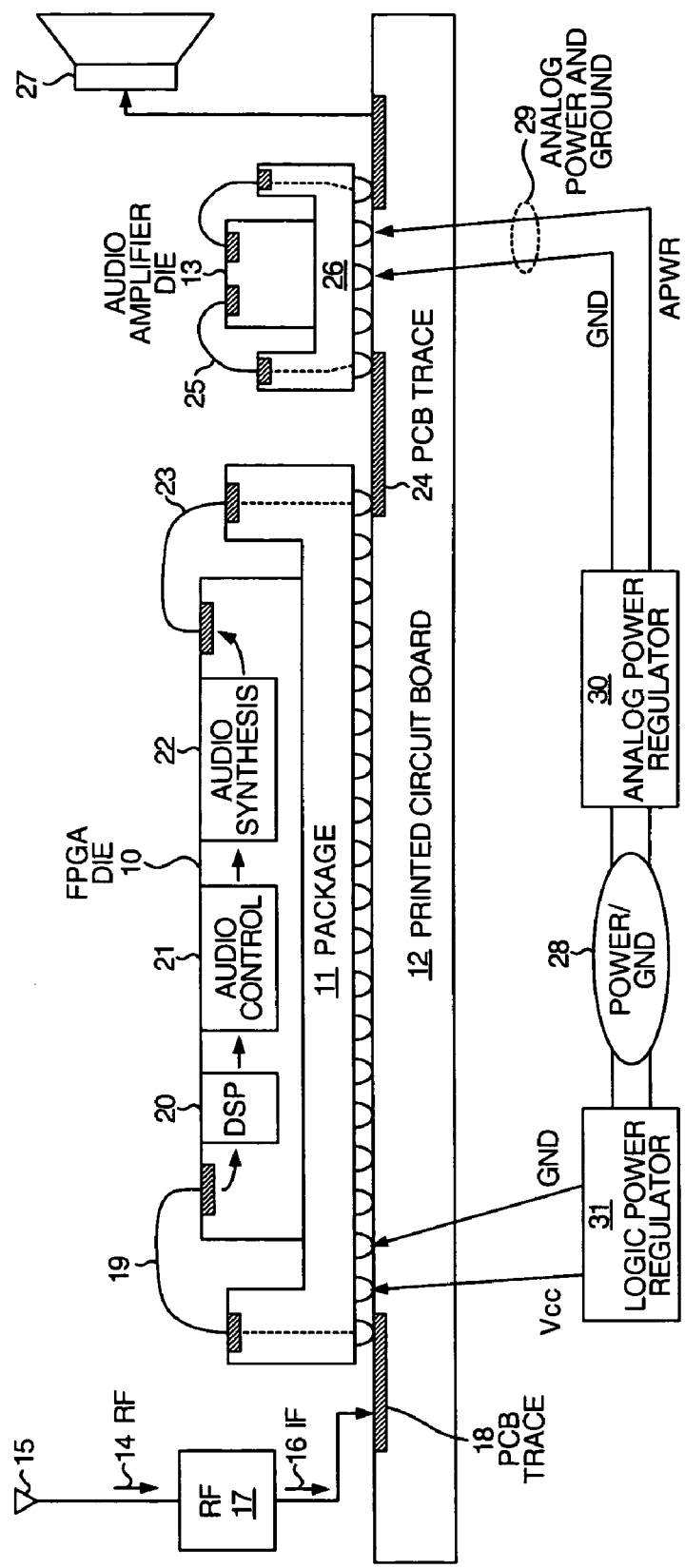
FIG. 1 (prior art) is a simplified cross-sectional diagram of an FPGA and an audio amplifier die mounted separately on a printed circuit board.
Figure 2:
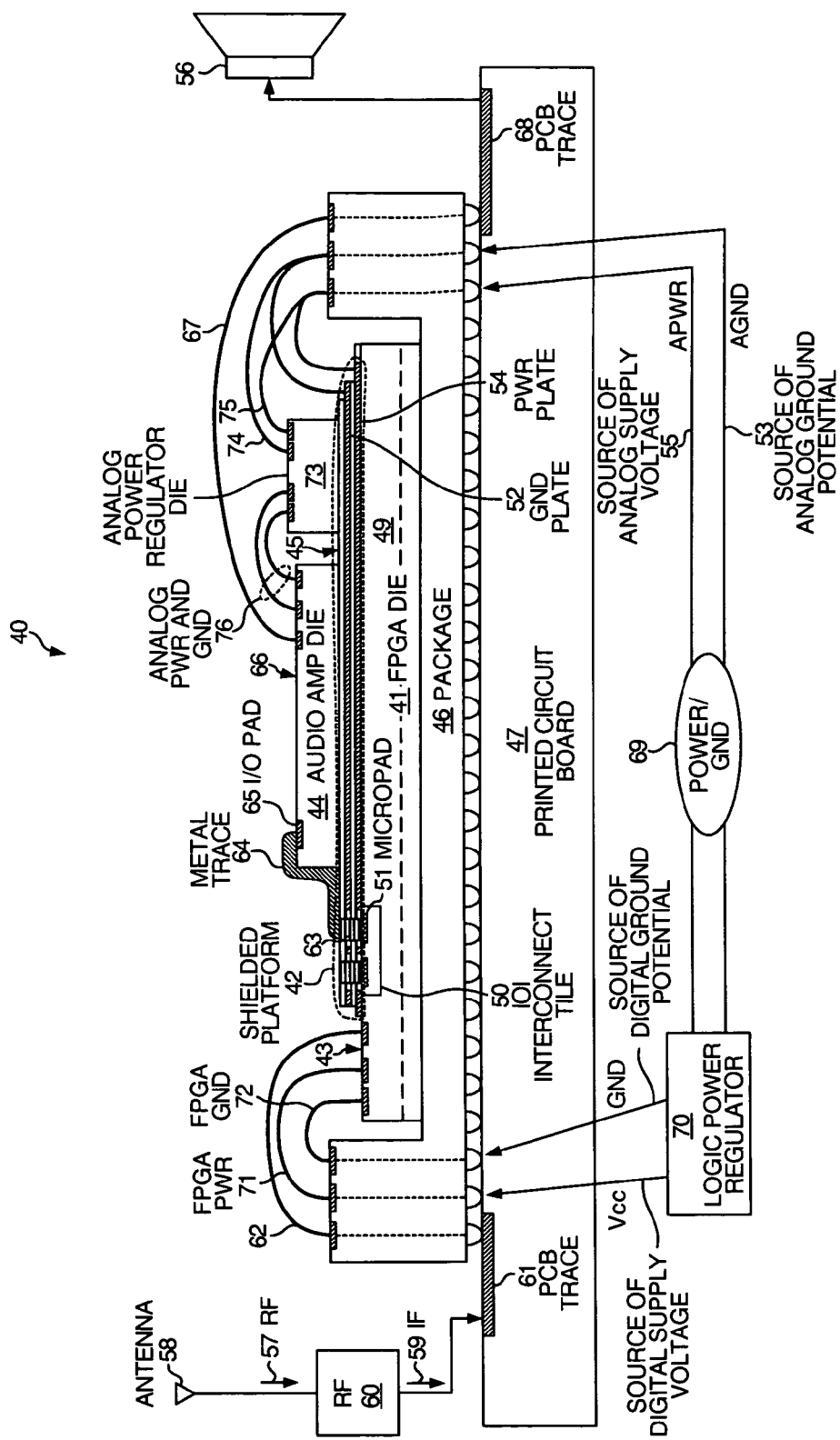
FIG. 2 is a simplified cross-sectional diagram of an audio amplifier die disposed on a shielded platform on an FPGA.

FIG. 2 shows a die assembly 40 in which an FPGA die 41 is used in an analog application within a cell phone. FIG. 2 is a simplified cross-sectional diagram of FPGA die 41 that has been provided with a shielded platform 42. Shielded platform 42 is disposed on upper surface 43 of FPGA die 41. An analog audio amplifier die 44 is die-bonded to an upper surface 45 of shielded platform 42 opposite FPGA die 41. FPGA die 41 is housed in an integrated circuit package 46 that is disposed on a printed circuit board 47. FPGA die 41 contains a digital logic portion 49 comprising digital circuitry fabricated on a semiconductor substrate. The digital circuitry may, for example, be FPGA circuitry that switches large amounts of current and that consequently emits electromagnetic radiation in the audio frequency range. The term audio here denotes 0 to 40 kHz.

In this embodiment, upper surface 43 is the face side of FPGA die 41. The term "face side" used here denotes the side of the die that receives the bulk of semiconductor processing such that circuitry is fabricated on that face side of the die. A plurality of interconnect tiles, including IOI interconnect tile 50, is distributed across upper surface 43. Each interconnect tile has a plurality of micropads. A micropad 51 is disposed on IOI interconnect tile 50. Micropad 51 is used to establish a connection between FPGA die 41 and audio amplifier die 44. A predetermined pattern of micropads on the interconnect tiles provides a standardized way of connecting circuitry in a die stacked on shielded platform 42 to the switch fabric of FPGA die 41. Numerous different types of dice, in addition to audio amplifier die 44, can be connected to FPGA die 41 if they have corresponding patterns of micropads to mate with the micropads on the interconnect tiles of FPGA die 41. For additional information on interconnect tiles, see New et al. U.S. patent application Ser. No. 10/610,207 filed Jun. 30, 2003, the subject matter of which is incorporated herein by reference.

Shielded platform 42 includes two conductive plates. In this embodiment, the plates are metal. An analog ground potential (GDN) is supplied onto metal plate 52 from an analog ground potential source (for example, ground 53). An direct current (DC) analog supply voltage is supplied onto metal plate 54 from an analog power source (for example, source 55). Metal plates 52 and 54 are coupled by bond wires and through package 46 to solder bumps of a ball grid array on the bottom of package 46. The solder bumps are in turn coupled to analog ground potential source 53 and analog power source 55. By coupling metal plate 54 to a direct current (DC) voltage source, metal plate 54 isolates audio amplifier die 44 from noise radiated by FPGA die 41. Die assembly 40 can thus perform the analog application of driving a cell-phone speaker 56 with less noise. Moreover, space on printed circuit board 47 is saved due to the stacking of audio amplifier die 44 on shielded platform 42 above FPGA die 41. Additional space on printed circuit board 47 is saved by stacking audio amplifier die 44 on FPGA die 41 because the separate integrated circuit package for audio amplifier die 44 is eliminated.

RF signals 57 are received by an antenna 58 and converted to IF signals 59 by RF circuitry 60. The IF signals 59 are then communicated to FPGA die 41 through a trace 61 on printed circuit board 47 and through a bond wire 62 between package 46 and FPGA die 41. The IF signals 59 are digitized, and then circuitry in FPGA die 10 performs digital signal processing and audio signal processing. The resulting audio signals are then communicated from FPGA die 41 to audio amplifier die 44 through micropad 51 on IOI interconnect tile 50. Audio signals need not be driven over a trace on printed circuit board 47 to reach audio amplifier die 44. Thus, the power required to drive audio signals over physically large traces on a printed circuit board is conserved by stacking audio amplifier die 44 on shielded platform 42 above FPGA die 41.

Audio signals travel from micropad 51, through a conductive via 63 that passes through a through hole in shielded platform 42, to a small metal trace 64. The through hole is composed of holes in each layer of shielded platform 42. The through hole passes through insulative keepout areas in the metal plates 52 and 54. Metal trace 64 extends up from conductive via 63, laterally across upper surface 45 of shielded platform 42, up and over a side edge of audio amplifier die 44 and connects conductive via 63 to an I/O pad 65 on a face surface 66 of audio amplifier die 44. Although metal trace 64 is employed in this embodiment, it is not used in other embodiments where audio amplifier die 44 is flip-chip mounted onto shielded platform 42 such that I/O pad 65 (or a flip-chip microbump on I/O pad 65) makes direct contact with conductive via 63. Audio amplifier die 44 amplifies the audio signals and outputs amplified analog audio signals onto a bond wire 67. The amplified signals then travel over a trace 68 on printed circuit board 47 to speaker 56.

FPGA die 41 is powered by a power/ground supply 69 through a logic power regulator 70 located on printed circuit board 47. FPGA power is supplied from package 46 to FPGA die 41 over a bond wire 71, and FPGA ground is connected to FPGA die 41 by a bond wire 72. Due to FPGA circuitry drawing spikes and surges of supply current, ground and Vcc supply potentials at the FPGA exhibit a significant amount of noise in the audio frequency range.

To isolate this noise, audio amplifier die 44 is not powered directly by logic power regulator 70 that powers FPGA die 41. Instead, analog ground (AGND) and analog power (APWR) are regulated by a separate analog power regulator die 73 that is disposed on shielded platform 42. Analog power regulator die 73 is thus shielded from electromagnetic radiation that is emitted in the audio range by circuitry on FPGA die 41.

Figure 3:
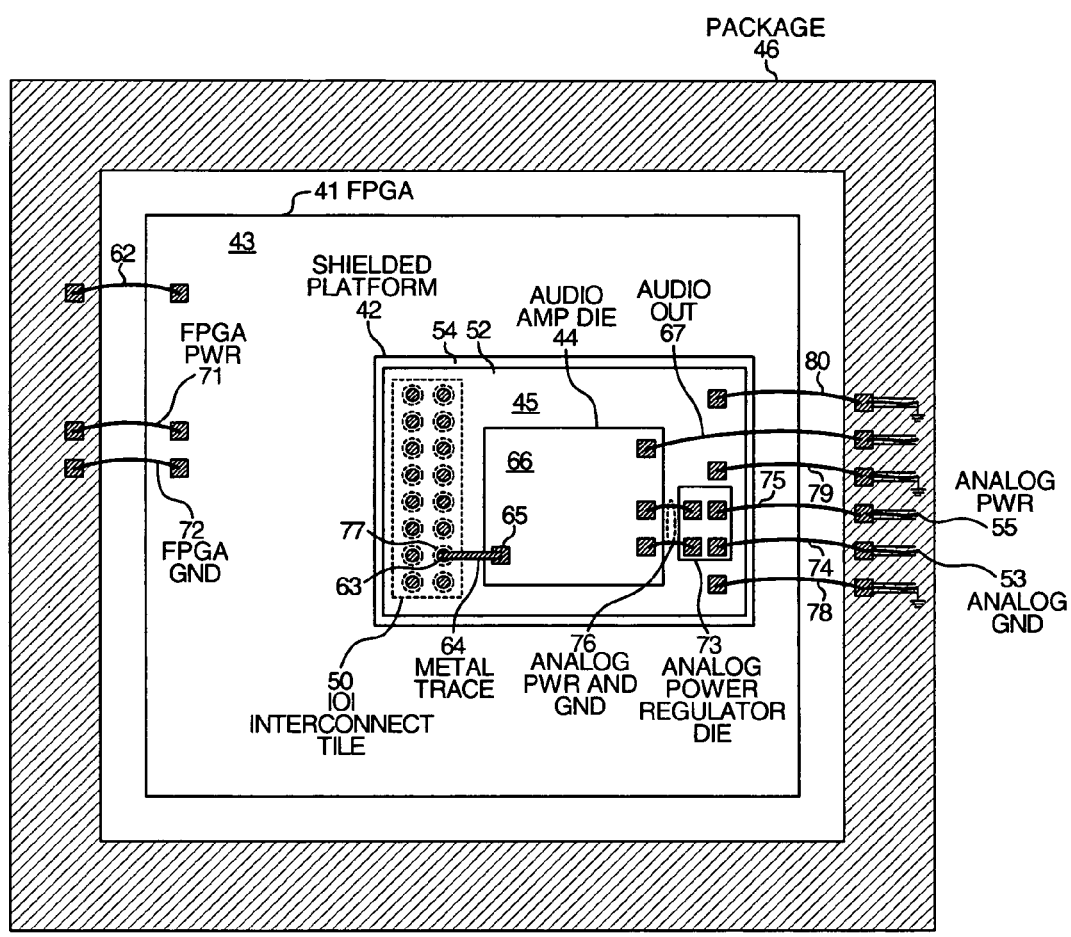
FIG. 3 is a simplified top-down diagram of the FPGA, the shielded platform and the audio amplifier die of FIG. 2.

FIG. 3 is a simplified top-down diagram of FPGA die 41 with shielded platform 42. Audio amplifier die 44 and analog power regulator die 73 are die-bonded onto upper surface 45 of shielded platform 42. IOI interconnect tile 50 is covered by shielded platform 42, and conductive via 63 protrudes up through a through hole in shielded platform 42. The outline of an insulative keepout area 77 in metal plate 52 is shown with a dashed line. The insulative keepout area 77 is filled with an insulating material such that conductive via 63 does not contact, and is insulated from, metal plate 52 of shielded platform 42.

Bond wires 78 and 79 are coupled to analog ground potential source 53 and are disposed on either side of bond wires 74 and 75. Bond wires 78 and 79 therefore provide a measure of shielding for bond wires 74 and 75 that connect analog power and ground to the analog circuitry in audio amplifier die 44 and in analog power regulator die 73. An additional bond wire 80 is also coupled to analog ground potential source 53 and runs along audio-out bond wire 67 opposite bond wire 79. Bond wires 79 and 80 thus also provide a measure of shielding for audio-out bond wire 67 through which audio signals are communicated to speaker 56.

Figure 4:
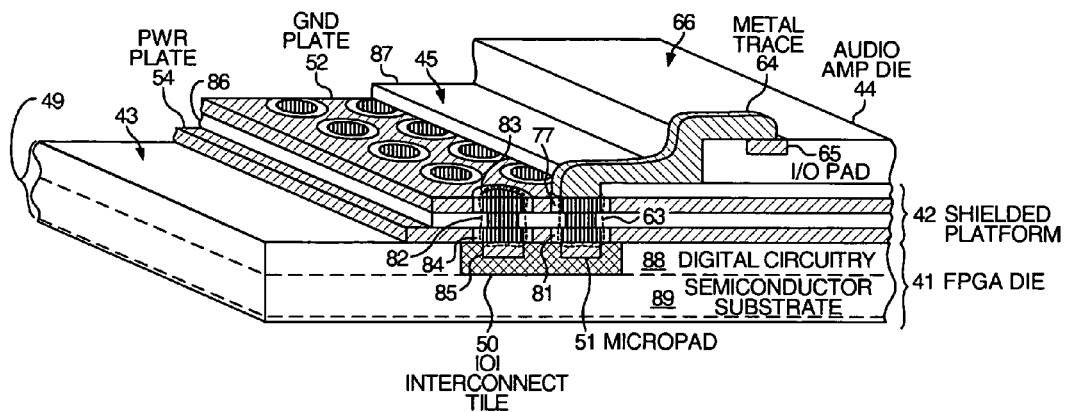
FIG. 4 is a more detailed, three-dimensional, cross-sectional view of the shielded platform of FIG. 2, showing a conductive via through the shielded platform.

FIG. 4 is a three-dimensional, cross-sectional view of FPGA die 41, shielded platform 42 and audio amplifier die 44, showing conductive via 63 in more detail. Conductive via 63 connects micropad 51 to metal trace 64 by passing through keepout area 77 in metal plate 52. Conductive via 63 also passes through a keepout area 81 in metal plate 54. In the illustrated embodiment, conductive via 63 is a stack of conductive plugs. Each plug is formed after each layer of shielded platform 42 is deposited.

Shielded platform 42 also contains additional conductive vias, such as conductive via 82. Conductive via 82 passes through keepout areas 83 and 84 and contacts an additional micropad 85 on IOI interconnect tile 50. The conductive vias extend up from IOI interconnect tile 50. Ten conductive vias are shown in the top-down diagram of FIG. 4 for illustrative purposes. Actual interconnect tiles are coupled to tens or even hundreds of conductive vias. In the analog application that uses audio amplifier die 44, no connection is made from audio amplifier die 44 to any of the additional conductive vias.

FIG. 4 also shows an insulating layer 86 between metal plates 52 and 54. In addition, an insulating layer 87 covers metal plate 52. Upper surface 45 of shielded platform 42 is the outer surface of insulating layer 87. Digital logic portion 49 of FPGA die 41 includes digital circuitry 88 over a semiconductor substrate 89. IOI interconnect tile 50 extends from upper surface 43 of FPGA die 41 down to semiconductor substrate 89.

Figure 5:
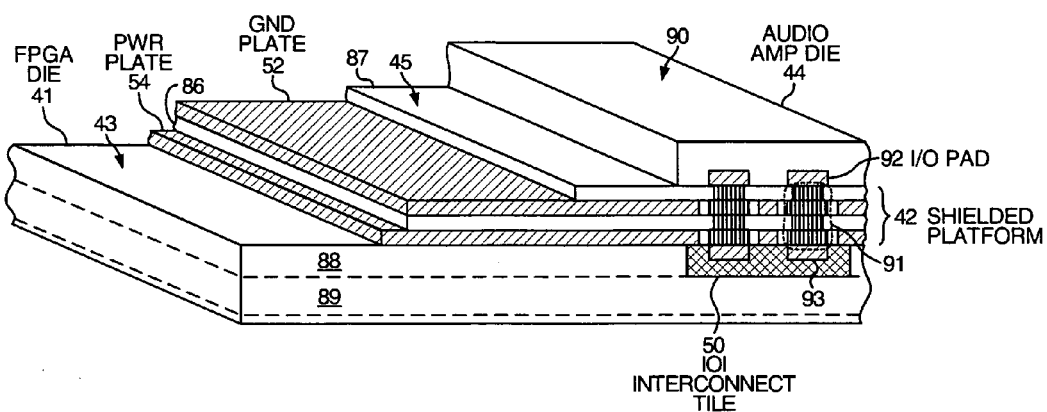
FIG. 5 is a three-dimensional, cross-sectional view of an audio amplifier die with an I/O pad array flip-chip mounted onto a shielded platform.

FIG. 5 shows an alternative embodiment wherein the face side surface 66 of audio amplifier die 44 is die-bonded onto shielded platform 42. The face surface 66 of audio amplifier die 44 contacts upper surface 45 of shielded platform 42 such that I/O pads on face surface 66 contact conductive vias that protrude through insulating layer 87 of shielded platform 42. Convalent die-bonding may be used. A back side 90 of audio amplifier die 44 is exposed.

IOI interconnect tile 50 is disposed laterally under audio amplifier die 44. A conductive via 91 extends orthogonally through shielded platform 42 and couples an I/O pad 92 on face surface 66 of audio amplifier die 44 to a micropad 93 on the underlying IOI interconnect tile 50. Conductive via 91 passes through keep out areas in metal plates 52 and 54 such that electrical contact between conductive via 91 and metal plates 52 and 54 is avoided. In this alternative embodiment, metal traces that travel around edges of audio amplifier die 44 are not required to connect I/O pads on audio amplifier die 44 to micropads on FPGA die 41.

Figure 6:
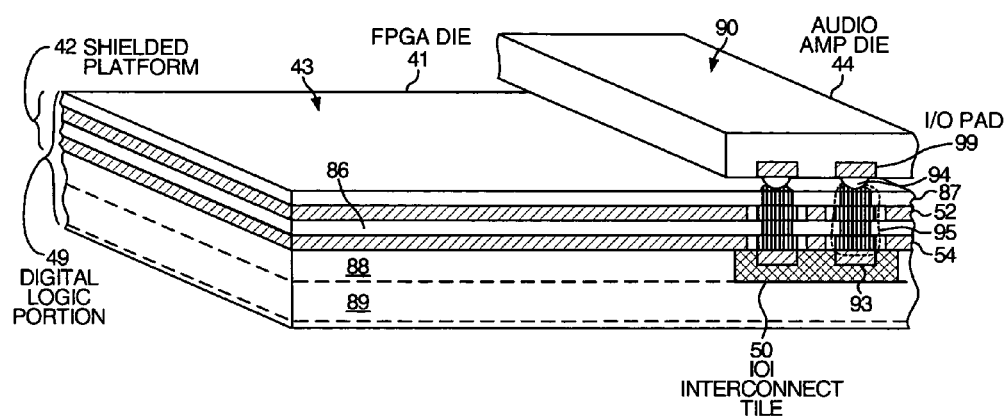
FIG. 6 is a three-dimensional, cross-sectional view of an audio amplifier die with a solder-ball array flip-chip mounted onto a shielded platform.

FIG. 6 shows yet another embodiment in which metal plates 52 and 54 of shielded platform 42 are patches of metal in the layers of FPGA die 41. The upper surface of the shielded platform 42 is the upper surface of FPGA die 41. Insulating layer 87 of shielded platform 42 covers the entire face side of FPGA die 41. The entire thickness of shielded platform 42 is the thickness of several metallization layers and insulation layers. For example, shielded platform 42 can be less than 100 microns thick. Conductive vias in a predetermined pattern protrude through metal plates 52 and 54 and constitute part of a standard pattern of interconnect tiles on upper surface 43 of FPGA die 41. Die-bonded products from second source manufacturers can interface to the standard pattern of interconnect tiles and conductive vias that protrude through upper surface 43 of FPGA die 41.

In the embodiment shown in FIG. 6, the face surface 66 of audio amplifier die 44 has an array of I/O pads with associated flip-chip microbumps. The array of flip-chip microbumps is mounted onto the standard pattern of conductive vias that protrude through upper surface 43 of FPGA die 41. For example, a microbump 94 connects to the top surface of a conductive via 95. Conductive via 95 extends orthogonally through shielded platform 42 and couples microbump 94 to micropad 93 on IOI interconnect tile 50.

In accordance with one embodiment, the temperature of shielded platform 42 is controlled. A resistor or other power dissipating element is disposed underneath shielded platform 42. A temperature detecting element (for example, a diode) is also disposed underneath shielded platform 42. The amount of current conducted through the power dissipating element is controlled such that the temperature of shielded platform 42 remains substantially constant. Where the temperature detecting element is a diode, the power dissipated by the power dissipating element is controlled such that the voltage drop across the temperature-detecting diode is maintained at a desired level. Shielded platform 42 acts to distribute the heat generated by the power dissipating element evenly underneath audio amplifier die 44.

Although certain specific exemplary embodiments are described above in order to illustrate the invention, the invention is not limited to the specific embodiments. Although a voltage supply source is shown above as a conductor from the power supply to the integrated circuit, it could be a lead on the power supply or a bond wire. The shield could be tied to a DC potential such as power or ground, or it could be left floating. Although an audio amplifier die is used here as an example of a noise-sensitive analog die, this is only one example. The shielded platform described herein can accommodate other types of analog circuit die. A shielded platform upon which an analog die is mounted can be considered part of an underlying die, or alternatively can be considered a separate structure. Although the noise that the shielded platform shields from the noise-sensitive second die is described above in connection with an example where the noise is in the audio frequency range, the noise-sensitive second die may be sensitive to higher frequency noise and the shielded platform may be used to shield such higher frequency noise generated in the underlying programmable logic die from reaching and interfering with the noise-sensitive second die above. Accordingly, various modifications, adaptations, and combinations of various features of the described embodiments can be practiced without departing from the scope of the invention as set forth in the following claims.

What is claimed is:

1. An integrated circuit comprising:
   a digital logic portion including a semiconductor substrate and digital circuitry, the digital circuitry coupled to a first supply voltage source;
   a shielded platform disposed over said digital logic portion, said shielded platform having a conductive plate, said conductive plate being coupled to a second supply voltage source; and
   a second integrated circuit disposed over said shielded platform opposite said digital logic portion, said second integrated circuit being coupled to said second supply voltage source.

2. The integrated circuit of claim 1, wherein the integrated circuit is disposed within an integrated circuit package, wherein said first supply voltage source is a digital supply voltage terminal of said integrated circuit package, and wherein said second supply voltage source is an analog power terminal of said integrated circuit package.

3. The integrated circuit of claim 1, wherein said integrated circuit is a programmable logic device.

4. The integrated circuit of claim 1, wherein said digital circuitry emits an amount of electromagnetic radiation in the audio range, and wherein a lesser amount of electromagnetic radiation in the audio range is present adjacent to said shielded platform opposite said digital logic portion.

5. The integrated circuit of claim 1, wherein said second integrated circuit is flip-chip mounted to said integrated circuit.

6. The integrated circuit of claim 1, wherein said shielded platform has a second conductive plate, said second conductive plate being coupled to a source of an analog ground potential.

7. A device comprising:
 an integrated circuit die having a first surface, said integrated circuit die comprising digital circuitry that generates an amount of noise;
 a shielded platform disposed adjacent to said first surface of said integrated circuit die, said shielded platform having a conductive plate coupled to a direct current voltage source, wherein a lesser amount of noise is present adjacent to said shielded platform opposite said integrated circuit die; and
 a second die disposed adjacent to said shielded platform opposite said integrated circuit die, said second die coupled to said direct current voltage source.

8. The device of claim 7, wherein said integrated circuit die is a programmable logic device.

9. The device of claim 7, wherein said shielded platform has a second conductive plate coupled to an analog ground potential.

10. The device of claim 7, wherein said second die is die bonded to said shielded platform.

11. The device of claim 7, wherein said integrated circuit die is a programmable logic device, and said second die contains analog circuitry.

12. The device of claim 7, wherein an interconnect tile is disposed on said first surface of said integrated circuit die, and wherein said second die is coupled to said interconnect tile by a via that passes through a through hole in said shielded platform.

13. A method comprising:
 supplying a voltage to digital circuitry within an integrated circuit die;
 supplying a direct current voltage to analog circuitry within a second die, said second die disposed adjacent to said integrated circuit die; and
 supplying said direct current voltage to a conductive plate of a shielded platform, said shielded platform being part of said integrated circuit die and contacting said second die.

14. The method of claim 13, wherein said digital circuitry emits an amount of electromagnetic radiation, and wherein a lesser amount of electromagnetic radiation is present around said analog circuitry than said amount of electromagnetic radiation emitted by said digital circuitry.

15. The method of claim 13, wherein said integrated circuit die is a programmable logic device.

16. The method of claim 13, wherein said second die is flip-chip mounted onto said shielded platform.

17. The method of claim 15, further comprising:
 coupling said digital circuitry to said analog circuitry through a conductive via that passes through a through hole in said shielded platform.

18. The method of claim 17, wherein said conductive via is coupled to an interconnect tile disposed on said integrated circuit die.

19. The method of claim 13, further comprising:
 determining a die temperature of said second die; and
 adjusting a platform temperature of said shielded platform.

20. The method of claim 13, further comprising:
 mounting said second die on said shielded platform in a flip-chip manner.

* * * * *